United States Patent [19]
Kaufman et al.

[11] Patent Number: 5,308,251
[45] Date of Patent: May 3, 1994

[54] MOUNTING BRACKET WITH ESD PROTECTION FOR AN ELECTRICAL CONNECTOR

[75] Inventors: John W. Kaufman, Hershey; John L. Broschard, III, Harrisburg; John A. Woratyla, Camp Hill, all of Pa.

[73] Assignee: The Whitaker Corporation, Wilmington, Del.

[21] Appl. No.: 986,660

[22] Filed: Dec. 8, 1992

Related U.S. Application Data

[63] Continuation-in-part of Ser. No. 926,628, Aug. 10, 1992.

[51] Int. Cl.⁵ .............................. H01R 9/09
[52] U.S. Cl. ...................... 439/64; 439/108
[58] Field of Search ........ 439/62, 64, 65, 66, 439/67, 101, 108, 377

[56] References Cited

U.S. PATENT DOCUMENTS

| | | | |
|---|---|---|---|
| 3,775,643 | 11/1973 | Schachnow et al. | 317/101 |
| 3,932,016 | 1/1976 | Ammenheuser | |
| 4,046,443 | 9/1977 | Champagne | |
| 4,243,283 | 1/1981 | McSparran | 439/64 |
| 4,583,807 | 4/1986 | Kaufman et al. | |
| 4,732,365 | 3/1988 | Kloster | 254/10.5 |
| 4,756,696 | 7/1988 | Whiteman, Jr. | 439/79 |
| 4,776,805 | 10/1988 | Brown et al. | 439/64 |
| 4,861,277 | 8/1989 | Bina | 439/377 |
| 4,941,841 | 7/1990 | Darden et al. | 439/377 |
| 4,992,052 | 2/1991 | Verhoeven | 439/62 |
| 5,022,863 | 6/1991 | Keens et al. | 439/65 X |
| 5,051,099 | 9/1991 | Pickles et al. | 439/108 |
| 5,183,405 | 2/1993 | Elicker et al. | 439/108 |
| 5,187,648 | 2/1993 | Ito | 439/64 X |

OTHER PUBLICATIONS

Memory/PC Card Connector (Compatible with PCMCIA, Release 2.0; AMP Incorporated; Dec. 1991.
PC Card Standard, Release 2.0, Personal Computer Memory Card International Association (PCMCIA); Sep. 1991.
InterConnection Technology, IHS Group Publication; *Surface Mount Connector Hold Downs;* Aug. 1992.
Technical Paper; AMP; *Surface Mount Connector Hold Downs;* By: Henry B. Collins and Tim Kocher; Copyright 1991, by AMP Incorporated.

*Primary Examiner*—Larry I. Schwartz
*Assistant Examiner*—Khiem Nguyen
*Attorney, Agent, or Firm*—Gerald K. Kita

[57] ABSTRACT

An electrical connector (1) comprises; a housing (2), a card receiving mouth (3), electrical contacts (4), prong receiving sockets (26) on the housing, (2) card guide arms (5, 6), a prong (25) on each of the guide arms (5, 6) for locking engagement with any one of the sockets (26), and a mounting bracket (64) engaging a ground plane (74) on a memory card (73) and being shunted to a ground plane on a circuit board (9).

7 Claims, 4 Drawing Sheets

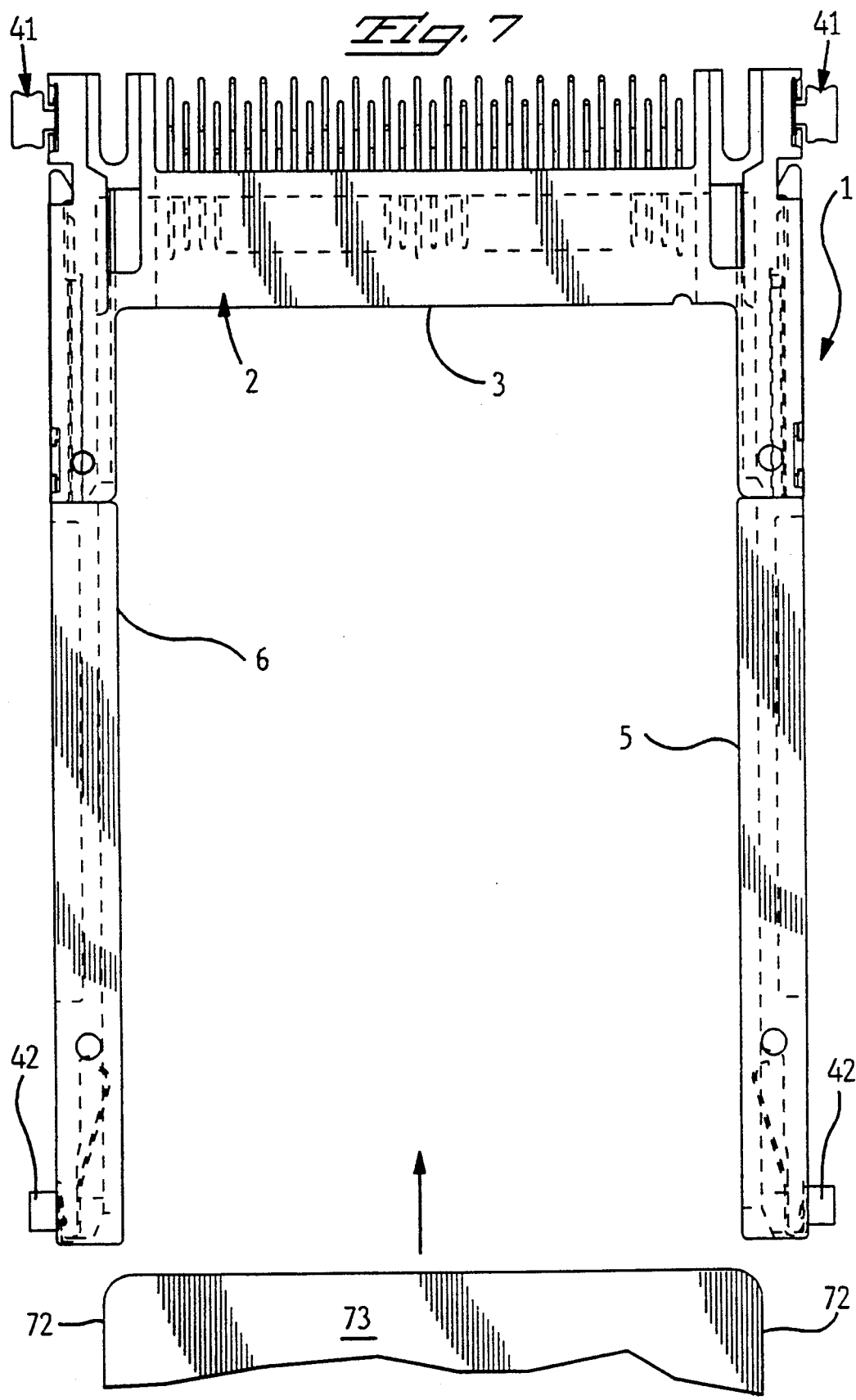

MOUNTING BRACKET WITH ESD PROTECTION FOR AN ELECTRICAL CONNECTOR

CROSS REFERENCE TO RELATED APPLICATION

This application is a continuation in part of application Ser. No. 07/926,628 filed Aug. 10, 1992.

FIELD OF THE INVENTION

The invention relates to a mounting bracket for an electrical connector for a card reader, and more particularly, to a mounting bracket for an electrical connector having guide arms for guiding a card into the connector.

BACKGROUND OF THE INVENTION

A known electrical connector, disclosed in U.S. Pat. No. 4,952,161, comprises, a card connector having card guide grooves for guiding two cards in an overlapping manner. It would be desirable to adapt such a card connector for mounting to either one of a first circuit board or a second, inverted circuit board.

SUMMARY OF THE INVENTION

The present invention resides in an electrical connector for a card reader, comprising, a card receiving housing and a set of card guide arms constructed with card receiving grooves for guiding edges of a card to be received in a mouth of the housing. The connector is adapted for mounting to a circuit board by a mounting bracket for solder connection to a circuit board. The mounting bracket is constructed for assembly in selected channels in the housing and in the guide arms. Each of the channels is constructed to receive the solder connection of the bracket in an inverted position or in a noninverted position and to be held by the bracket against a circuit board to which the bracket is connected by solder.

DESCRIPTION OF THE DRAWINGS

An embodiment of the invention will now be described by way of example with reference to the accompanying drawings in which;

FIG. 7 is a plan view of the electrical connector shown in FIG. 1 with components parts assembled.

DETAILED DESCRIPTION

Figure 1:
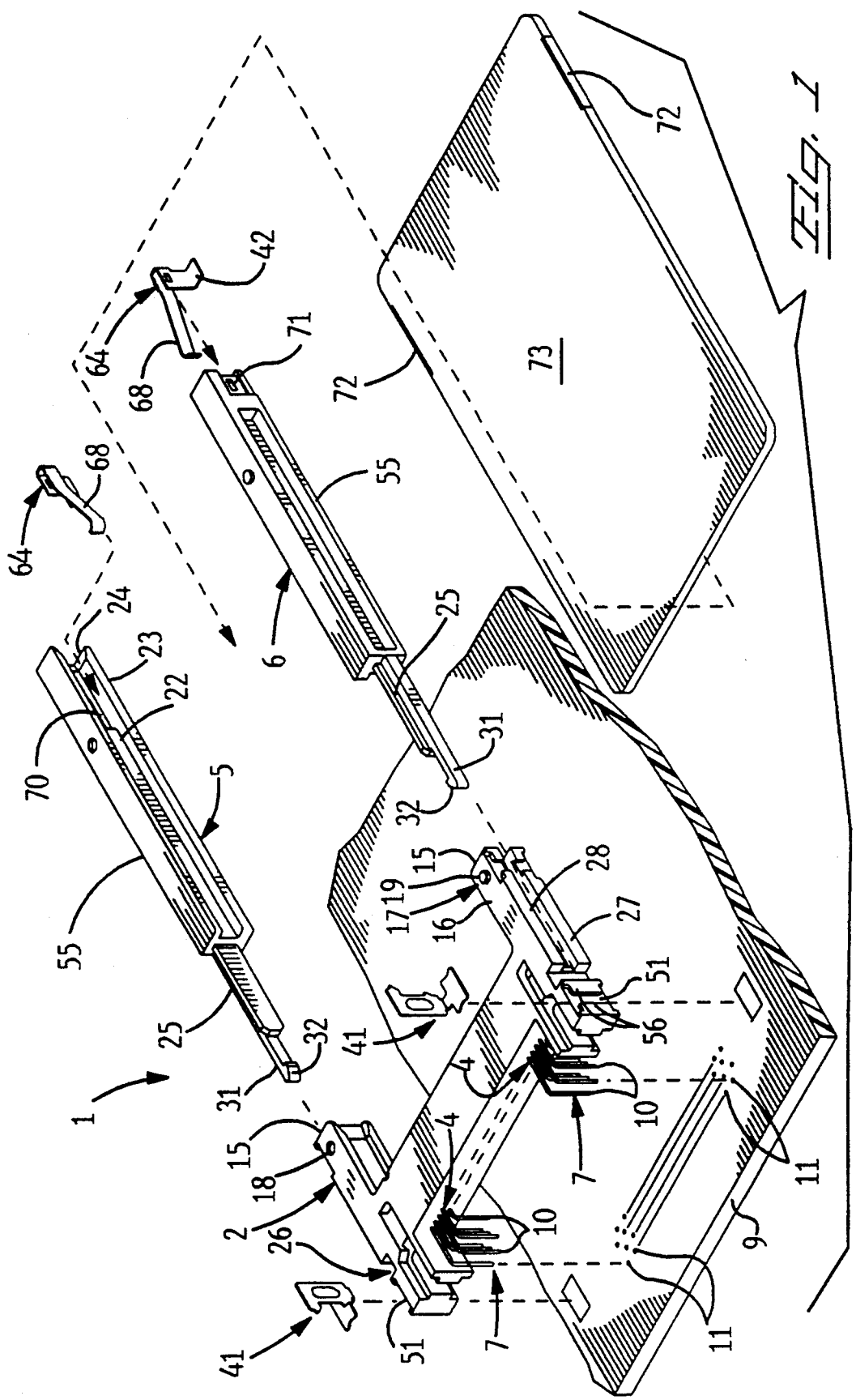
FIG. 1 is a perspective view of an electrical connector having a housing and a set of card guide arms for a single card, together with mounting brackets, electrical grounding contacts and a circuit board.
Figure 2:
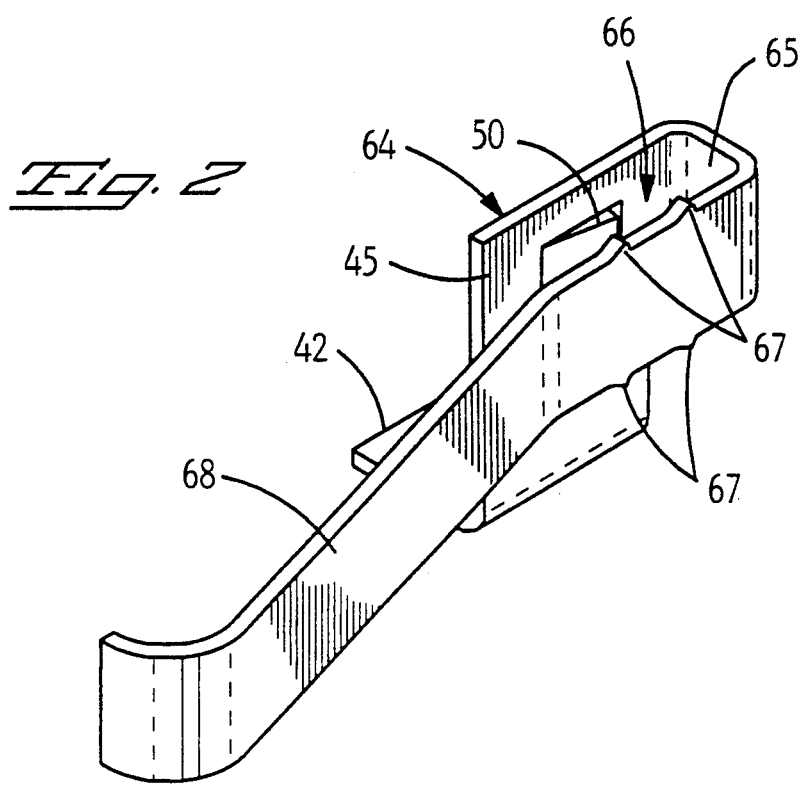
FIGS. 2 and 3 are perspective views of the electrical grounding contacts shown in FIG. 1.

With reference to FIG. 1, an electrical connector 1, especially suitable for use in a card reader, not shown, includes an insulating housing 2 having a card receiving mouth 3, FIG. 2, multiple electrical contacts 4 held by the housing 2 extending in two rows and into the mouth 3, and a set of card guide arms 5, 6. Tail sections 7 of the contacts 4 extend outwardly of a rear surface 8 of the housing 2 for connection to a first circuit board 9 shown in phantom outline. Feet 10 on free ends of the contacts 4 are adapted with respective shapes for connection to the circuit board 9. For example, the feet 10 are shaped as posts for insertion into plated apertures 11 of the circuit board 9. Alternatively, the feet 10 can be shaped as surface mount flat portions, not shown, for connection to surface mount pads on the circuit board 9. A bottom surface 12 is on the housing 2. The housing 2 has starter grooves 14 in forwardly projecting housing arms 15 on opposite sides of the mouth 3. A top surface 16 of the housing 2 has a locking structure 17 in the form of a recess 18 on one side flanking the mouth 3, and a projecting knob 19 in another side flanking the mouth 3. The duplicate housings 2 can be stacked and interlocked, FIGS. 14 and 16, when inverted with respect to each other, with the recess 18 of each housing receiving the knob 19 of the other housing.

The guide arms 5, 6 are of unitary construction molded from a thermoplastic material FIG. 1, card receiving grooves 22 on inside surfaces 23 extend along lengths of the respective guide arms 5, 6. Flared, groove mouths 24 at respective ends of the guide arms 5, 6 open into respective grooves 22 of the guide arms 5, 6. At opposite ends of respective guide arms 5, 6, respective elongated prongs 25 extend outwardly.

The prongs 25 lockingly engage in sockets 26, the sockets 26 being in respective, exterior side surfaces 27 of the housing 2 flanking the mouth 3. The prongs 25 have respective cross sections that interfit slidably along grooves 28 in the respective, exterior side surfaces 27 of the housing 2. Ends of the prongs 25 have respective locking latches 31 with transverse, projecting fingers 32. The fingers 32 are forced to bend resiliently as they traverse in respective grooves 28, until the fingers 32 emerge from ends 33 of the grooves 28 and unbend to register against transverse latch shoulders 34 at the ends 33 of the grooves 28. Thereby, the prongs 25 lockingly engage the sockets 26.

With reference to FIG. 1, a mounting bracket 41 is inserted along each one of multiple channels 51 recessed in each of the side surfaces 27 of the housing 2. Flanges 56 overhang opposite sides of each channel 51, to overlap edges of a mounting bracket 41 in the channel 51. The guide arms 5, 6 are each assembled with mounting brackets 64. The mounting brackets 64 are constructed with the identity of one another, except in mirror image of one another.

Figure 3:
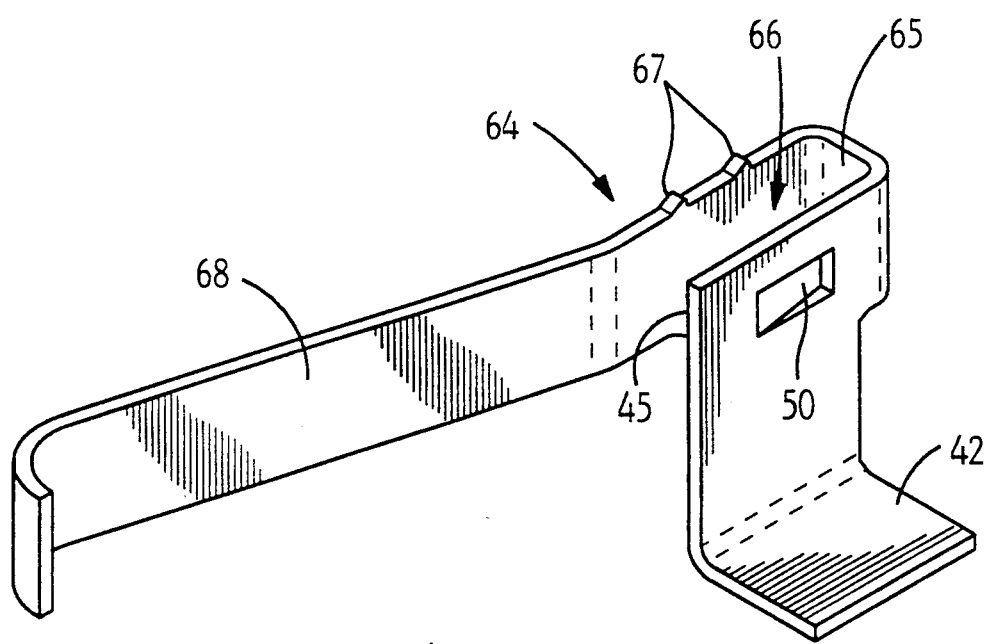
Figure 4:
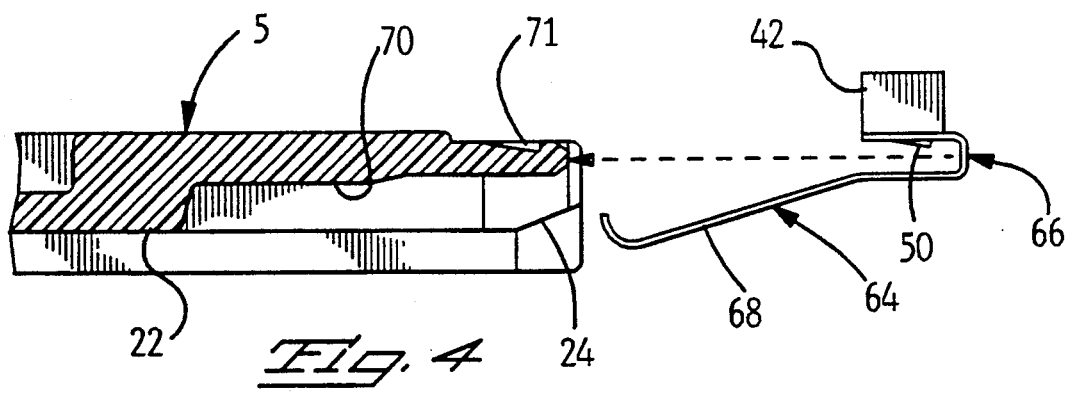
FIGS. 4 and 5 are perspective views of the grounding contact of FIG. 2 being assembled to a guide arm as shown in FIG. 1.
Figure 5:
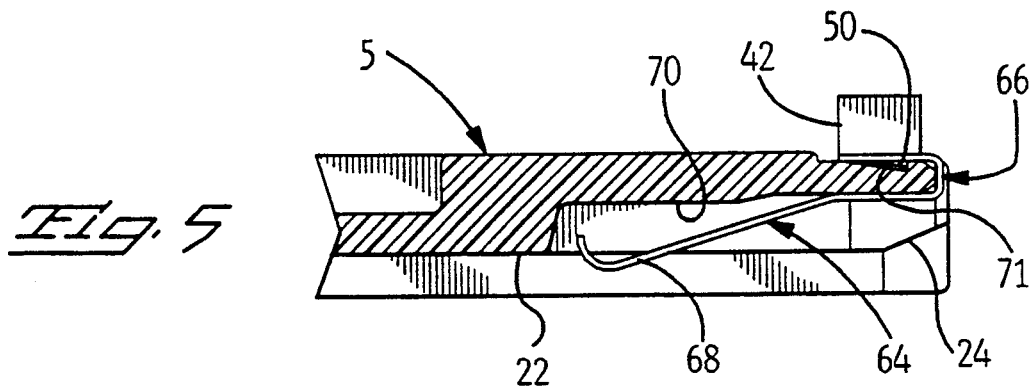
Figure 6:
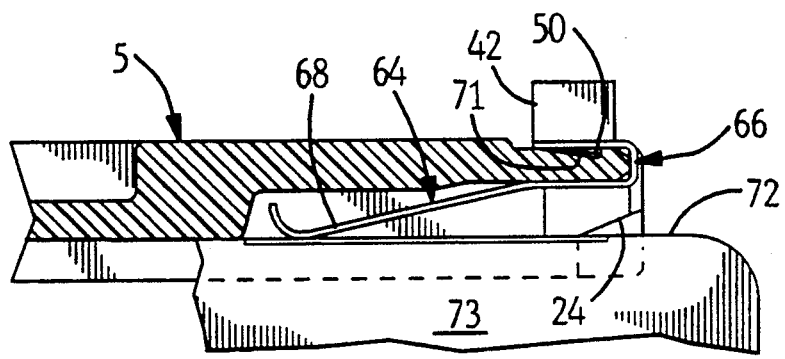
FIG. 6 is a view similar to FIG. 5, illustrating connection of a card to the grounding contact.

With reference to FIGS. 2 and 3, each of the two mounting brackets 41, shown in FIGS. 2 and 3, is stamped and formed from a strip of metal, and comprises, a flat base 42 and at least one arm 45 projecting from the base 42. The base 42 is bent to extend transverse to the thickness plane of the arm 45. A hold down finger 49 extends laterally from the arm 45 in the thickness plane of the arm 45. A length of the finger 49 is then doubled back on itself into a bight 65. The finger 49 projects from the bight 65. The finger 49 and the arm 45 extend from opposite ends of the bight 65 to define opposite sides of a clasp 66 that wraps around an end of either the guide arm 5 or the guide arm 6. Lances 67 on opposite edges of the finger 49 are along one side of the clasp 66. Along another sided of the clasp 66, a projection or latch 50, comprising a blade, is struck diagonally out of a thickness plane of the arm 45, and projects inwardly of the clasp 66. An elongated, resilient spring finger 68 extends from the clasp 66. The spring finger 68 has a curved end 69 and is bent to extend diagonally into a groove 22 of either the guide arm 5 or the guide arm 6.

With reference to FIGS. 1 and 4-6, the groove 22 in each of the guide arms 5 and 6 is deepened by a cavity 70 in a bottom of the groove 22. Sides of the groove 22 extend along opposite sides of the cavity 70. The cavity 70 communicates with the same end as does the groove mouth 24. A latch receiving inset 71 with a front facing, stop shoulder is in the exterior side 55. The clasp 66 is assembled over the end of either the guide arm 5 or the guide arm 6, until the latch 50 registers in the inset 71, the shoulder of the inset 71 resisting removal of the clasp 66. The lances 67 lodge against opposite sides of the cavity 70, which may also comprise opposite sides of the groove 22. The spring finger 68 is bent to extend diagonally into the groove 22 to engage an edge 72 of a memory card 73 slidably received along the groove 22. The card receiving mouth 3 is adapted to receive a memory card 73 known in the industry, and disclosed, for example, in U.S. Pat. No. 5,033,972. In particular, a ground plane 74 on an exterior of the memory card 73 extends along the edge 72, and provides a conductive shield that protects circuitry and electronics in the memory card 73 from electrical influences due to electromagnetic interference, EMI, and electrostatic discharge, ESD. The spring finger 68 frictionally engages the ground plane 74 of a memory card 73 in the connector 1. The mounting bracket 6 electrically connects the ground plane 74 of the memory card 73 to a ground plane on the circuit board 9. Thereby, when the memory card 73 is grasped, during its insertion or removal with respect to the connector 1, ESD or EMI induced voltages are shunted electrically through the mounting bracket 64 to a ground plane on the circuit board 9.

According to an advantage of the invention, a mounting bracket 64 comprises a grounding contact providing ESD and EMI protection for a memory card 73 during its insertion or removal with respect to an electrical connector 1. According to another advantage a bight 66 of the mounting bracket 64 provides a cantilever support for the resilient finger 68, enabling deflection of the finger 68 in a plane parallel to a plane of the base 42 and its solder connection to the circuit board 9. Deflection of the spring finger 68 will take place in a plane parallel to the circuit board 9, avoiding a tendency to lift and separate the guide arms 5, 6 from the circuit board 9. According to another advantage, the arm 45 will bend at its connection with the base 42 to isolate the base 42 from mechanical stresses imparted in the arm 45.

Other embodiments of the invention and modifications of the invention are intended to be covered by the spirit and scope of the claims defining the invention.

We claim:

1. An electrical connector comprising: a housing; a card receiving mouth in the housing; electrical contacts carried by the housing in the mouth; guide arms on opposite sides of the mouth; a card receiving groove on each of the guide arms; a grounding contact in each groove, each grounding contact comprising; a resilient spring finger projecting in the card receiving groove of a guide arm to engage a card inserted along the card receiving groove, a base providing a solder connection to a circuit board, a finger, an arm between the base and the finger, and the finger and the arm clasping the guide arm to provide a secure connection of the grounding contact to the guide arm.

2. An electrical connector as recited in claim 1, further comprising: a bight formed by the finger, the bight being wrapped around an end of the guide arm and providing a cantilever support for the resilient finger enabling deflection of the resilient finger in a plane parallel to a plane of the base and parallel to a plane of a solder connection to a circuit board.

3. An electrical connector as recited in claim 1, further comprising: a bend separating the base from the arm.

4. An electrical connector comprising: a housing; a card receiving mouth in the housing; electrical contacts carried by the housing in the card receiving mouth; guide arms on opposite sides of the card receiving mouth; a card receiving groove on each of the guide arms; a grounding contact at an end of each of the guide arms, each grounding contact comprising: a base providing a solder connection to a circuit board, a finger, a resilient spring finger extending from the finger and projecting in the card receiving groove of a guide arm to engage a card inserted along the card receiving groove, the finger being wrapped around said end of the guide arm; and a mouth at said end of the guide arm for receiving a card to be engaged by the ground contact at said end of the guide arm.

5. An electrical connector as recited in claim 4, and further comprising: a bend separating the base from the arm, a bight formed by the finger, the bight being wrapped around said end of the guide arm, the bight being formed by said finger and providing a cantilever support for the resilient finger enabling deflection of the resilient finger in a plane parallel to a plane of the base.

6. An electrical connector as recited in claim 4, and further comprising: a bight engaging said end of the guide arm, the bight being formed by said finger wrapped around the end of the guide arm and providing a cantilever support for the resilient finger enabling deflection of the resilient finger in a plane parallel to a plane of the base and parallel to a plane of a solder connection of the base to a circuit board.

7. An electrical connector as recited in claim 6, further comprising: a bend separating the base from the arm.

* * * * *